United States Patent [19]

Yamakawa et al.

[11] Patent Number: 5,254,851
[45] Date of Patent: Oct. 19, 1993

[54] WIDE-DYNAMIC RANGE LIGHT RECEIVER

[75] Inventors: Hideaki Yamakawa, Tokyo; Hiroyuki Ibe, Yokohama, both of Japan

[73] Assignee: Kabushiki Kaisha Toshiba, Kawasaki, Japan

[21] Appl. No.: 805,059

[22] Filed: Dec. 11, 1991

[30] Foreign Application Priority Data

Dec. 26, 1990 [JP] Japan .................................. 2-418380

[51] Int. Cl.⁵ .......................................... H01J 40/14
[52] U.S. Cl. ................................. 250/214 A; 359/189
[58] Field of Search ........... 250/214 R, 214 A, 214 B, 250/214 L; 307/311; 359/189, 190, 191

[56] References Cited

U.S. PATENT DOCUMENTS

| 4,952,795 | 8/1990 | Gauthier et al. | 250/214 A |
| 5,023,951 | 6/1991 | Kahn | 359/189 |
| 5,111,324 | 5/1992 | Jahromi | 250/214 A |

FOREIGN PATENT DOCUMENTS 2-226923  9/1990  Japan .

Primary Examiner—David C. Nelms
Attorney, Agent, or Firm—Oblon, Spivak, McClelland, Maier & Neustadt

[57] ABSTRACT

A wide-dynamic range light receiver according to the present invention is constructed such that a non-linear impedance element is connected in series to a light-receiving element, and a resistor and a capacitor are connected in series between a connection node of the light-receiving element and the non-linear impedance element and an input terminal of a low-noise amplifier. The impedance of the non-linear impedance element increases as the output of the light-receiving element approaches a minimum reception light level, and the non-linear impedance element is finally set in the non-conductive state. Thus, at the minimum reception light level, the output current of the light-receiving element is supplied, with little loss, to the low-noise amplifier via the pure resistor and the capacitor. In addition, the impedance of the non-linear impedance element decreases exponentially in accordance with the increase in the input of the light-receiving element. Consequently, the output current of the light-receiving element begins to flow into the non-linear impedance element from a certain point, and the current to the low-noise amplifier is limited.

3 Claims, 3 Drawing Sheets

WIDE-DYNAMIC RANGE LIGHT RECEIVER

BACKGROUND OF THE INVENTION

1. Field of the Invention

The present invention relates to a light receiver employed generally for optical communications and having a relatively wide dynamic range.

2. Description of the Related Art

Conventional light receivers for optical communications include ones of the trans-impedance type shown in FIG. 1 and ones of the high-impedance type shown in FIG. 2. The light receiver shown in FIG. 1 is constructed such that an output terminal of a light receiving element 1 such as a pin-photo diode is connected to an input terminal of a low-noise amplifier 2 (hereinafter, called "front end"). The light receiver of FIG. 2 is constructed such that a bias resistor 3 is connected in series to a light receiving element 1, and a capacitor 4 for preventing a DC is connected between an input terminal of a front end 2 and a node between the light receiving element 1 and the bias resistor 3.

In either structure shown in FIG. 1 or FIG. 2, the circuit is optimized, taking a low light-receiving level into account. When the light-receiving level rises, an electric current or voltage greater than required for optimal operations is applied to the front end 2. In this case, an output waveform is distorted and a correct output waveform cannot be obtained.

Recently, there has been a strong demand for the advent of a light receiver having such a wide dynamic range characteristic as to respond to a high-level light input without fail, thereby matching various transmission distances in an optical communication subscriber system.

This type of light receiver with a wide dynamic range was already made public in lecture No. B-922 (1990) of Electronic Information Communication Association. The technique of this light receiver will now be described in brief with reference to FIG. 3.

This light receiver is an improvement on the transimpedance type receiver shown in FIG. 1. Referring to FIG. 3, the front end 2 is constituted by a parallel feedback amplifier comprising an FET amplifier 21, a feedback resistor 22 and a DC preventing capacitor 23. A DC portion of an output Vout from the front end 2 is cut off by the capacitor 23, and a resultant signal is fed to a current detector 5. The current detector 5 detects a current value of the input signal. The detected current value is supplied, as a voltage variation, to a difference amplifier 6. The difference amplifier 6 detects a difference voltage between the voltage variation from the current detector 5 and a reference voltage Vref. The difference voltage serves as a source input to an FET 7. The FET 7 biases the output of the light-receiving element 1 in accordance with the level of the source input.

Specifically, if the light-receiving element 1 is DC-coupled to the front end 2, as shown in FIG. 1, the input bias of the front end 2 rises in accordance with the increase in the level of received light. As a result, the output side is saturated and the dynamic range is limited. In the light receiver shown in FIG. 3, the FET 7 is provided on the input side of the front end 2, and the FET 7 is given a function of controlling an input DC level. The current to the FET 7 is increased in accordance with the rise in reception light level. According to this method, a dynamic range of 32 dB can be obtained. There is a problem, however, that the circuit configuration is complex.

The structure of another conventional wide-dynamic range light receiver is disclosed in Published Unexamined Japanese Patent Application (PUJPA) No. 2-226923. This light receiver will now be described in brief with reference to FIG. 4.

This light receiver is a further improvement wherein a capacitor 4 is provided on the input side of a transimpedance type front end 2 so that the front end 2 is used like the high-impedance type receiver shown in FIG. 2. Specifically, the light receiver has a bias circuit comprising a resistor 8 and a pair of Schottky barrier diodes 9 and 10. A predetermined bias current flows in the bias circuit, thereby setting the output terminal of the light-receiving element 1 at a specified bias level. When the reception light level rises, the impedance of the diode 10 lowers and the impedance of the diode 9 rises. Thus, the current flowing into the front end 2 does not exceed the value of an initial bias current. Accordingly, even if the level of light received rises, output saturation of the front end 2 can be avoided and the wide-dynamic range characteristic attained.

This system, however, always requires a bias current, and power consumption is high. At a minimum reception light level, the impedances of the diodes 9 and 10 are equal and the current is equally divided. Consequently, the minimum reception light level is degraded by about 3 dB.

As has been described above, in the conventional wide-dynamic range light receivers, the circuit configuration is complex and, even if the dynamic range is expanded to a high reception light level, the minimum reception light level is degraded.

SUMMARY OF THE INVENTION

The object of the present invention is to provide a wide-dynamic range light receiver having a dynamic range increased to a high level of reception light, with simple circuit configuration, without degrading the minimum level of reception light.

According to the present invention, there is provided a wide-dynamic range light receiver comprising a light-receiving element for receiving a light signal and converting the light signal into a current signal, a non-linear impedance element, connected in series to the light-receiving element, having an impedance which increases as an output from the light-receiving element becomes closer to a minimum reception light level, the non-linear impedance element being substantially in the non-conductive state at the minimum reception light level, the impedance of the non-linear impedance element being decreased exponentially in accordance with the increase in the output of the light-receiving element, a low-noise amplifier for amplifying a current signal derived from a connection node between the light-receiving element and the non-linear impedance element, and outputting the amplified signal, and a pure resistor connected in series between the connection node of the light-receiving element and the non-linear impedance element and an input terminal of the low-noise amplifier.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate a presently preferred embodiment of the invention, and together with the general description given above and the detailed description of the preferred embodiment given below, serve to explain the principles of the invention.

DETAILED DESCRIPTION OF THE PREFERRED EMBODIMENTS

An embodiment of the present invention will now be described with reference to FIGS. 5 to 8.

Figure 1:
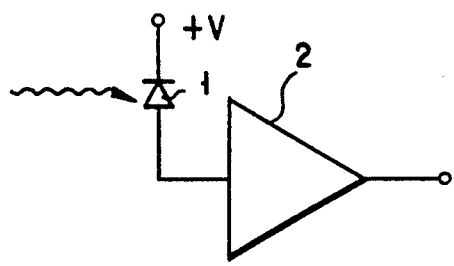
FIG. 1 is a circuit diagram showing the structure of a conventional trans-impedance type light receiver.
Figure 2:
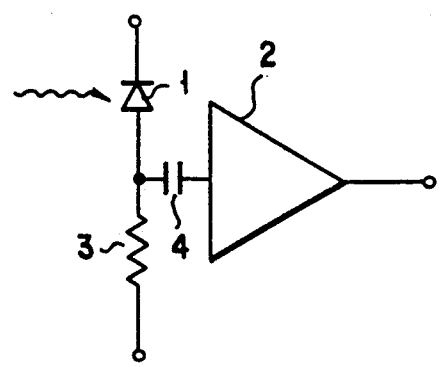
FIG. 2 is a circuit diagram showing the structure of a conventional high-impedance type light receiver.
Figure 3:
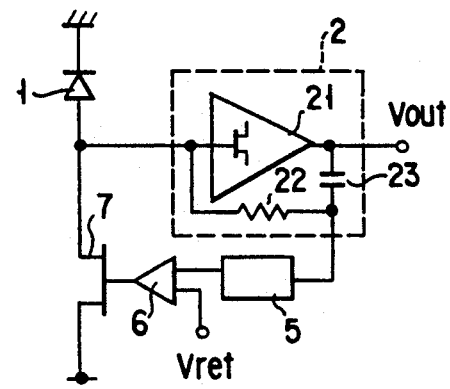
FIG. 3 is a circuit diagram showing a first example of a conventional wide-dynamic range type light receiver.
Figure 4:
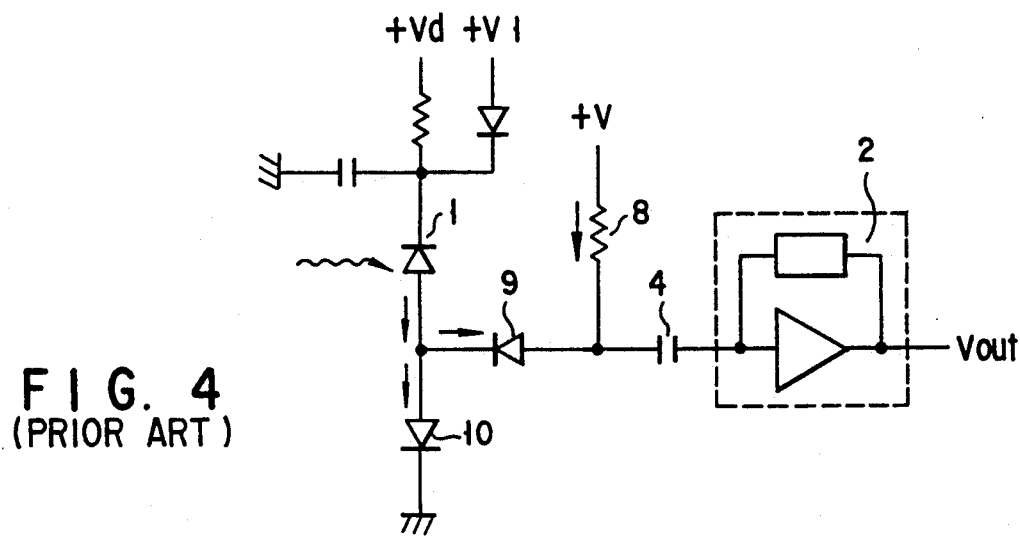
FIG. 4 is a circuit diagram showing a second example of a conventional wide-dynamic range light receiver.
Figure 5:
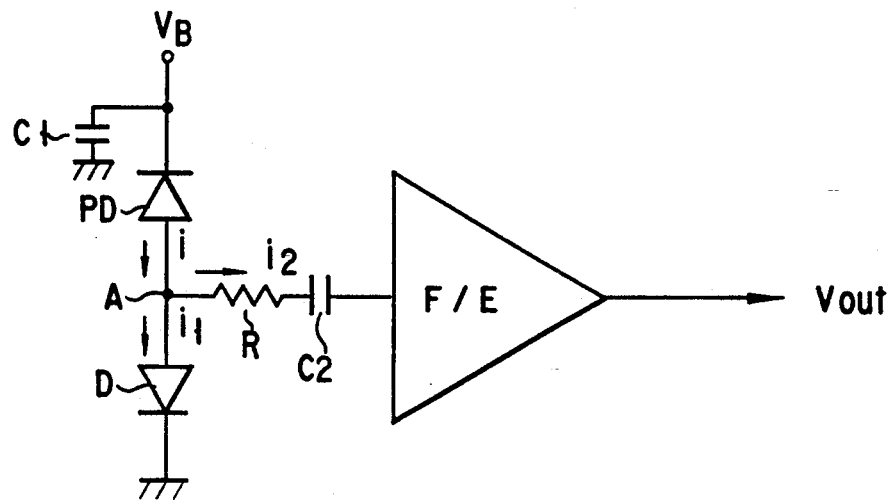
FIG. 5 is a circuit diagram showing the structure of a wide-dynamic range light receiver according to an embodiment of the present invention.

FIG. 5 shows the structure of a wide-dynamic range light receiver according to the present invention. The cathode of a pin photodiode PD or a light-receiving element is connected to a power source VB and grounded via a capacitor C1. The anode of a diode PD is connected via a pure resistor R and a coupling capacitor C2 to an input terminal of a front end F/E constituted by a trans-impedance amplifier. The anode of the diode PD is connected to the anode of a Schottky barrier diode D. The cathode of the diode D is grounded.

In the above structure, the current output from the pin photodiode PD is represented by "i", the current flowing to the Schottky barrier diode D is represented by "i1", and the current input to the front end F/E is represented by "i2". A connection node between the anode of the pin photodiode PD and the cathode of the Schottky barrier diode D is A. Symbols "i1" and "i2" denote branch currents of the current i.

Figure 6:
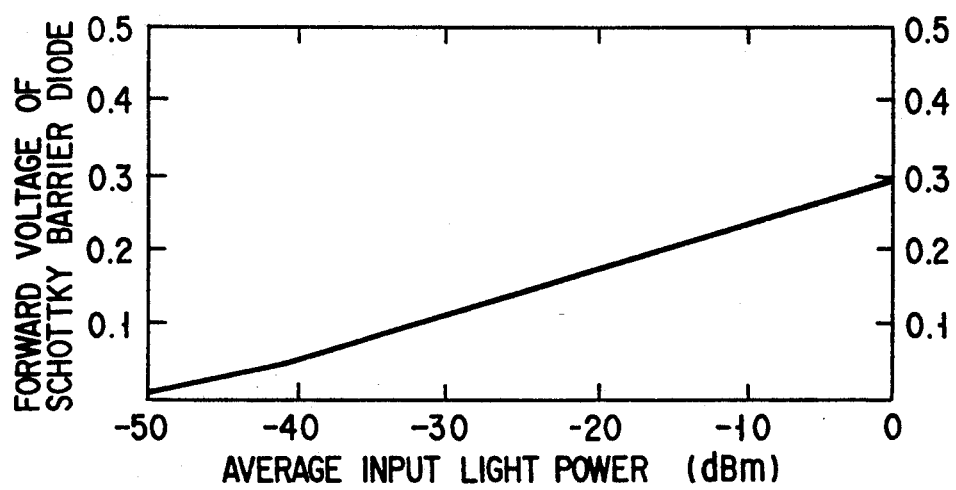
FIG. 6 is a graph showing the relationship between the average light input power of the light receiver and the forward voltage of the Schottky diode barrier shown in FIG. 5.
Figure 7:
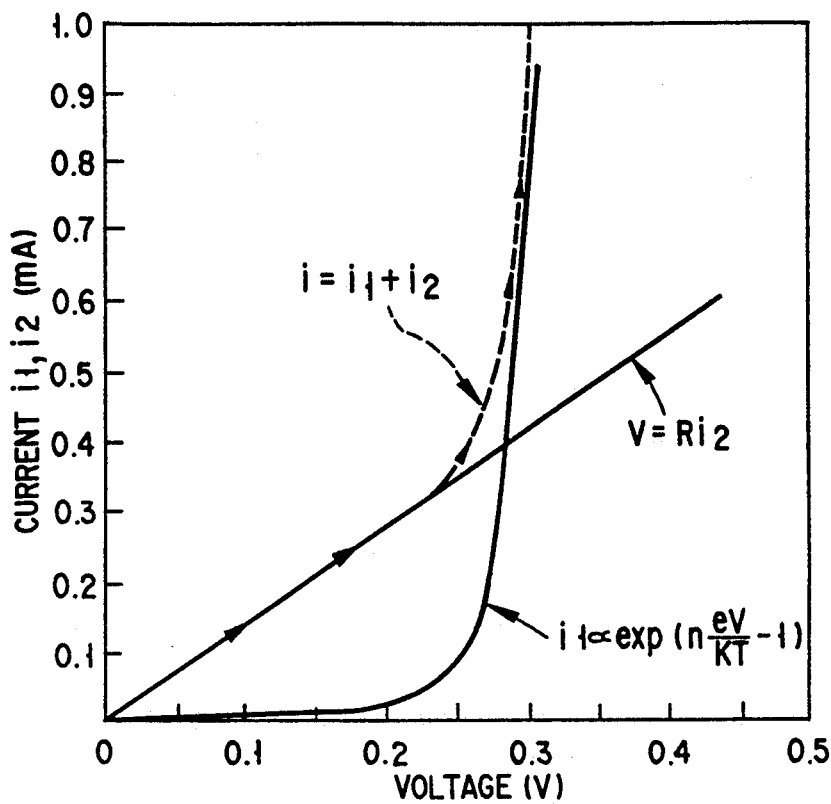
FIG. 7 is a graph showing the relationship between the forward voltage-current characteristic of the Schottky diode and the operation current in the circuit shown in FIG. 5.
Figure 8:
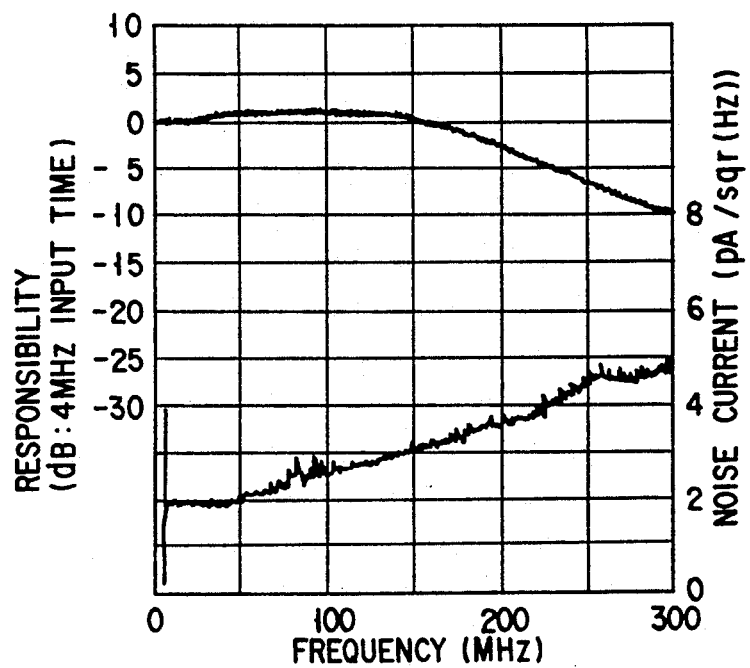
FIG. 8 is a graph showing waveforms for explaining low-noise properties of the light receiver of FIG. 5.

FIG. 6 is a graph showing the relationship between the average light input power (power of light received) of the light receiver and the forward voltage of the Schottky diode barrier D. FIG. 7 shows the relationship between the forward voltage of the Schottky barrier diode D and the currents i, i1 and i2. Referring to FIGS. 6 and 7, the operation of the above light receiver will now be described, on the assumption that the transmission rate is 155.52 Mbit/s.

First, the operation of the light receiver, in the state wherein the reception light level of the pin photodiode PD is low. When pulse signal light is input to the pin photo-diode PD at a transmission rate of 155.52 Mbit/s, the lowest reception light level is approximately $-35$ dBm. In this case, the forward voltage of the Schottky barrier diode D is 0.1 V (see FIG. 6), whereas the current i1 hardly varies (see FIG. 7). Specifically, since the diode d is in the high-impedance state, the diode D is substantially in the non-conductive state. Accordingly, most of the current i received at the photodiode P is let to flow into the front end F/E without loss.

Suppose that the impedance of the Schottky barrier diode D is Rshot and the input impedance of the front end F/E is Zin. In this case, the current i2 input to the front end F/E is given by $$i2 = i \cdot Rshot/(R1 + Zin + Rshot)$$

according to the law of shunt current.

When Rshot = 2 MΩ, R1 = 100 Ω and Zin ≤ 100 Ω, the current i2 is given by $$i2 = i \cdot 20000/(100 + 100 + 20000)$$

Thus, the penalty at the time of minimum reception light level is substantially negligible.

In the meantime, the addition of the Schottky diode D increases the input capacity. There is a concern that an equivalent input noise density of the front end F/E may increase. The noise was actually measured on the basis of the above set values, and the results shown in FIG. 8 were obtained. It was thus confirmed that the light receiver had low-noise properties. In the example shown in FIG. 8, the noise is 2.5 pA/Hz on average in the band. Since the noise level is low even if the diode D is added, the minimum level of light received is scarcely deteriorated.

On the other hand, as the reception light level of the pin photodiode PD increases, the impedance of the Schottky barrier diode D decreases exponentially (see FIG. 7). For example, when the light input power is 0 dBm, the forward voltage of the Schottky barrier diode D is about 0.3 V (see FIG. 6). At this time, the impedance of the diode D is very low, and most of output current i of the pin photodiode PD flows into the diode D as current i1. In addition, even when the light input power increases, the forward voltage of the Schottky barrier diode D is kept at about 0.3 V (see FIG. 7). Thus, the current i2 to the front end F/E is substantially unchanged.

The limit value of the current i2 can easily be set by inserting the pure resistor R in the current path of the current i2 in series, as shown in FIG. 5. Specifically, when the input impedance is Zin, the limit value of the current i2 is give by $$i2 = 0.3/(R + Zin)$$

In the above example, R is about 100 Ω.
In the above example, R is about 100 Ω.

Accordingly, even when the reception light level is high, the current i2 towards the front end F/E is limited. Thus, the front end F/E can be stably operated. Thereby, a wide dynamic range can be achieved without distorting an output waveform.

The above description is based on the assumption that no light component is emitted when the light input is at the zero level. However, when the laser is biased to a threshold value or above at the zero level, the pure resistor R is connected to the capacitor C2, as shown in FIG. 5. That is, a DC component of current i2 is cut by capacitor C2, the operation point of the front end F/E is stabilized and the above advantageous effect can be obtained.

In the light receiver having the above structure, even when the light input power is close to the minimum reception light level, the Schottky barrier diode D is in the high-impedance state. Thus, most of current i received by the photodiode PD flows into the front end F/E, and the connection node is biased. As a result, the fort end F/E can be stably operated. In addition, as the reception light level increases, the impedance of the Schottky barrier diode D decreases exponentially and the forward voltage of the diode D is reduced. Consequently, in conjunction with the function of the resistor R, the current i2 to the front end F/E can be limited. The front end F/E can, therefore, be operated stably. Thus, the wide dynamic range can be attained without distorting the output waveform.

Additional advantages and modifications will readily occur to those skilled in the art. Therefore, the invention in its broader aspects is not limited to the specific details, and representative devices shown and described herein. Accordingly, various modifications may be made without departing from the spirit or scope of the general inventive concept as defined by the appended claims and their equivalents.

What is claimed is:

1. A wide-dynamic range light receiver comprising:
   a light-receiving element for receiving a light signal and converting the light signal into a current signal;
   a non-linear impedance element, connected in series to the light-receiving element, having an impedance which increases as an output from the light-receiving element becomes closer to a minimum reception light level, said non-linear impedance element being substantially in the non-conductive state at the minimum reception light level, the impedance of said non-linear impedance element being decreased exponentially in accordance with the increase in the output of the light-receiving element;
   a low-noise amplifier for amplifying a current signal derived from a connection node between the light-receiving element and the non-linear impedance element, and outputting the amplified signal; and
   a pure resistor connected in series between the connection node of the light-receiving element and the non-linear impedance element and an input terminal of the low-noise amplifier, the pure resistor determining a limit value of current input to said low-noise amplifier on he basis of the input impedance thereof.

2. The light receiver according to claim 1, wherein said non-linear impedance element is a Schottky barrier diode.

3. The light receiver according to claim 1, wherein a capacitor is connected in series to the pure resistor between the connection node of the light-receiving element and the non-linear impedance element and an input terminal of the low-noise amplifier.

* * * * *